United States Patent [19]

Shimotashiro et al.

[11] Patent Number: 4,629,994
[45] Date of Patent: Dec. 16, 1986

[54] FM DEMODULATOR

[75] Inventors: Masafumi Shimotashiro, Neyagawa; Masaaki Kobayashi, Kawanishi, both of Japan

[73] Assignee: Matsushita Electric Industrial Co., Ltd., Kadoma, Japan

[21] Appl. No.: 743,369

[22] Filed: Jun. 11, 1985

[30] Foreign Application Priority Data

Jun. 15, 1984 [JP] Japan .................. 59-123054
Jun. 20, 1984 [JP] Japan .................. 59-127026
Jun. 20, 1984 [JP] Japan .................. 59-127025
Dec. 12, 1984 [JP] Japan .................. 59-262110

[51] Int. Cl.⁴ ............................................. H03D 3/00
[52] U.S. Cl. ..................................................... 329/110
[58] Field of Search ............... 329/107, 110, 120, 126; 375/80, 82, 94, 96, 102, 103; 455/214, 216, 337

[56] References Cited

U.S. PATENT DOCUMENTS 3,971,998  7/1976  Gopinath et al. ............... 329/126 X
4,412,340 10/1983  Bartlett et al. .................. 375/102 X

FOREIGN PATENT DOCUMENTS 56-66907  6/1981  Japan .

OTHER PUBLICATIONS

A. Chowaniec and G. S. Hobson, "The Use of Charge-Coupled Devices for Single-Sideband Modulation", 1974, pp. 237-244, Int. Conf. on Tech. and Appl. of Charge-Coupled Devices.

Primary Examiner—Eugene R. LaRoche
Assistant Examiner—D. C. Mis
Attorney, Agent, or Firm—Wenderoth, Lind & Ponack

[57] ABSTRACT

An FM signal demodulator has a phase shifter including transversal filters for producing from a FM video signal two FM video signals which are different in phase by 90° from each other, and a demodulator for detecting phase information of the FM video signal, wherein the carrier frequency is at least quadrupled prior to demodulation so as to suppress components of the FM video signal not to be included in the demodulated video signal.

9 Claims, 10 Drawing Figures

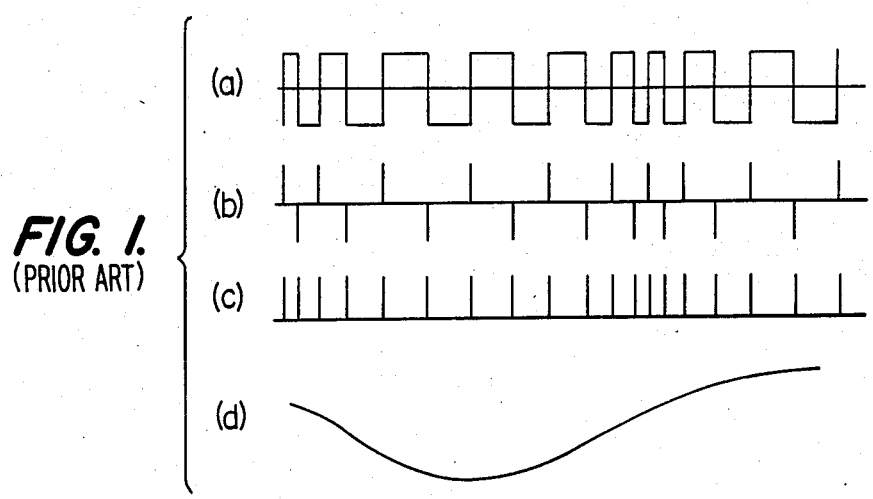
FIG. 1.
(PRIOR ART)
FIG. 3(a).
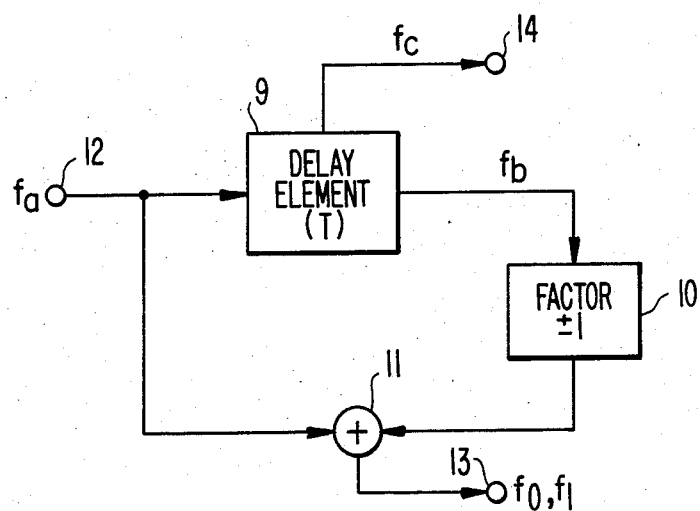
FIG. 3(b).
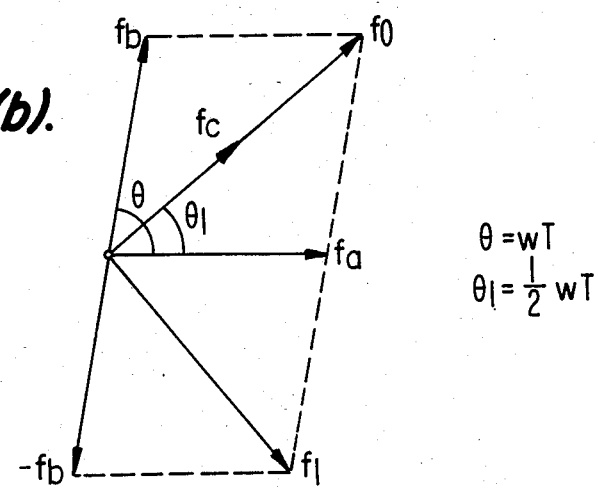
$\theta = wT$
$\theta_1 = \frac{1}{2} wT$

FM DEMODULATOR

BACKGROUND OF THE INVENTION

1. Field of the Invention

This invention relates to a demodulator for demodulating frequency-modulated (referred to as FM hereinafter) signals, and more particularly to a demodulator for demodulating FM video signals reproduced from a magnetic recording medium in a magnetic recording and reproducing apparatus such as a video tape recorder.

2. Description of the Prior Art

In the conventional video tape recorder (referred to as VTR hereinafter) and the like, an FM signal demodulating circuit demodulates the reproduced FM video signal by the so-called pulse counter method to obtain the original video signal. The reproduced FM video signal is passed in turn through a limiter to form a rectangular pulse-train signal like a compressional wave as shown in FIG. 1(a), through a differentiator to form a pulse-train signal as shown in FIG. 1(b), where it is further full-wave rectified to form a signal as shown in FIG. 1(c), and finally through an integrator to form a demodulated signal which is substantially equivalent to the original video signal as shown in FIG. 1(d). This signal processing is explained in detail in "Video Recording Techniques" by Nobutoshi Kihara, published by Sanpo Shuppan, Japan.

Since the carrier frequency of the FM video signal is very close to the higher side frequency of the video signal of VTR, a part of the FM video signal, when demodulated, becomes a crosstalk signal appearing in the original video signal, resulting in fine streaks or beats appearing on the display screen. For avoiding this crosstalk, in the conventional FM signal demodulating circuit, full-wave rectification is employed to double the carrier frequency, so that the crosstalk components of the FM video signal in the original video signal are suppressed. Usual home VTRs operate under a condition in which their video frequency band is 1.5 MHz, and their frequency deviation is 1.0 MHz, and their carrier frequency is 3.9 MHz. Therefore, the first and second lower sidebands do not cause crosstalk. However, if the conventional FM signal demodulating circuit is used in a VTR requiring a high resolution and a high S/N, or having a wide video transmission band and a large frequency deviation or emphasis, the second and third lower sidebands appear in the video signal as crosstalk signals, so as to cause deterioration of the picture quality. Moreover, in the conventional FM demodulating circuit in which the carrier frequency is doubled, the frequency deviation is doubled, so that powers of the second and third lower sidebands increase, resulting in production of fine streaks and beats notably, a deterioration of the S/N at the edge of video signal.

SUMMARY OF THE INVENTION

It is an object of the invention to provide a FM signal demodulator free from the above-mentioned defects, and adapted for demodulating FM video signals without causing crosstalk in the video signal, even when used in a VTR which has a high in resolution and S/N.

To achieve this object, the FM signal demodulator according to the present invention comprises: a phase shifting means having characteristics of a constant wide frequency band and a constant group delay, for producing from a FM video signal two FM video signals which are different in phase by 90° from each other; and a demodulating means for detecting phase information of the FM video signal from the two FM video signals from the phase shifting means wherein the FM video signal is demodulated after the carrier frequency is at least quadrupled.

The phase shifting means may comprise odd-type and even-type transversal filters for producing the two FM video signals which are different in phase by 90° from each other. The two FM video signals are respectively doubled in carrier frequency by known means, and the frequency-doubled FM video signals are added to each other, so as to thereby form a frequency-quadrupled FM video signal. This frequency-quadrupled FM video signal is demodulated by known means such as an integrator to form a video signal which is substantially identical with the original video signal. By a proper combination of this arrangement, the carrier frequency can be further multiplied prior to demodulation.

The above-mentioned feature of the present invention that the carrier frequency is at least quadrupled prior to demodulation of FM video signal enables the demodulation of the FM video signal without causing crosstalk of components of the FM video signal into the original video signal. Accordingly, this permits a VTR to have a high resolution and S/N without producing fine streaks or beats on the screen, and without deteriorating its S/N at the edge of the video signal. Further, owing to the use of transversal filters to generate the two FM video signals having phases which are different by 90° from each other, the relative phase difference (90°) can be ensured to remain constant in the overall frequency band. The phase characteristic of each of the transversal filters is linear, which ensures a constant group delay without consequent group delay distortion.

BRIEF DESCRIPTION OF THE DRAWINGS

FIGS. 1(a), 1(b), 1(c) and 1(d) are waveform diagrams at the stage of demodulation of the FM video signal in the conventional demodulator circuit;

FIGS. 3(a) and 3(b) are a block diagram of a transversal filter including a one-stage delay element, and its phase vector diagram;

DESCRIPTION OF THE PREFERRED EMBODIMENTS

The invention will be described more fully by way of examples with reference to the accompanying drawings.

Figure 2:
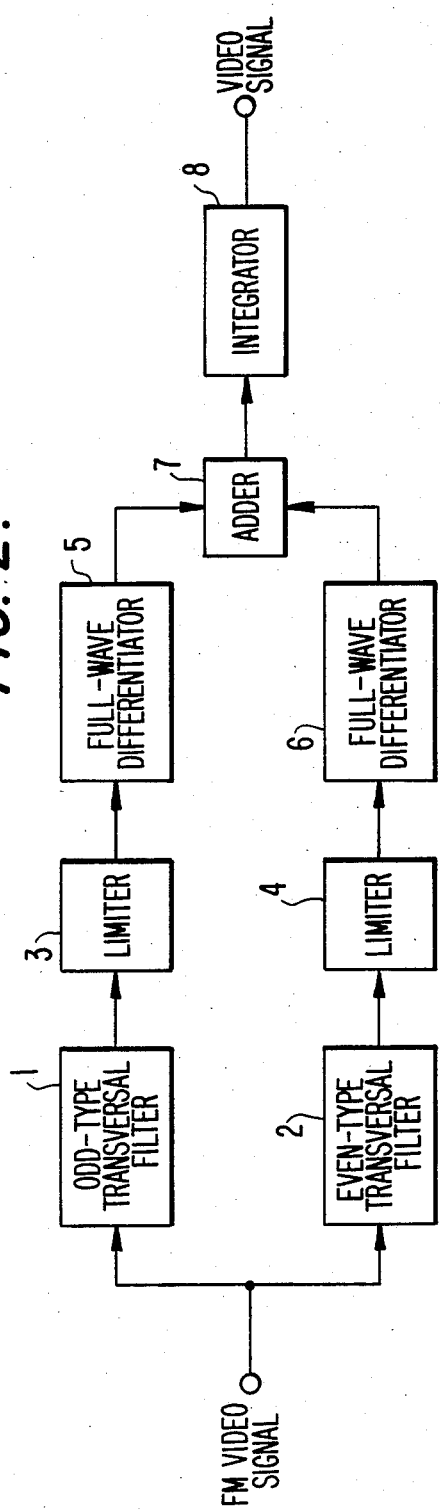
FIG. 2 is a block diagram showing an embodiment of FM signal demodulator according to the present invention.

Referring to FIG. 2, which shows a block diagram of the scheme of an embodiment according to the present invention, reference characters 1 and 2 designate odd-type and even-type transversal filters constituting a phase shifter, respectively. An FM video signal is inputted into the odd-type and even-type transversal filters 1 and 2, and at their outputs, constant group frequency-delayed FM video signals which are different in phase by 90° from each other in the whole frequency band are obtained. The two FM video signals are supplied to limiters 3 and 4 of the same construction, respectively, to become rectangular pulse-train signals as shown in FIG. 1(a). Each of the limiter circuits 3 and 4 can be formed of a differential amplifier. The outputs of the limiters 3 and 4 are inputted into full-wave differentiators 5 and 6 which are identical in construction. Each of the full-wave differentiators 5 and 6 is a known differentiator formed of capacitors, resistors and an AND circuit. From the full wave differentiators 5 and 6, pulse signals as shown in FIG. 1(c) whose carrier frequencies are doubled are outputted, and then inputted into an adder 7, which can be formed of resistors. The construction of limiters 3 and 4 and full-wave differentiators 5 and 6 are the same as those of the conventional FM signal demodulating circuit. Since the carrier frequencies of the outputs of the full wave differentiators 5 and 6 are twice that of the input FM video signal, and the phases thereof are different by 90° from each other, at an output terminal of the adder 7 is obtained a carrier frequency-quadrupled pulse signal. This signal is supplied to an integrator 8. The integrator 8 which is a general low-pass filter, extracts the original video signal from the FM video signal. Such quadruplication of the carrier frequency enables the circuit to avoid crosstalk of the components of FM video signal up to the third lower sideband. This is expressed by the following formula, assuming a carrier frequency $f_c$, and a video signal band $f_{ab}$, and a frequency generated by the third lower sideband when the carrier frequency is quadrupled $f_{3w}$:

$$f_{3w} = 4f_c - 3f_{ab} \quad (1)$$

If one substitutes the condition where the third lower sideband is suppressed: $f_{3w} \geq f_{ab}$ for equation (1), then $$f_{3w} = 4f_c - 3f_{ab} \geq f_{ab} \quad (2)$$

$$\therefore f_c \geq f_{ab} \quad (3)$$

Formula (3) is always established in usual VTRs. Accordingly, it is possible to suppress components of the FM signal up to the third lower sideband.

FIG. 3(a) shows a transversal filter constructed with one delay element (delay T). An input signal $f_a$ inputted to an input terminal 12 is delayed by a time T by a delay element 9 to form a delayed signal $f_b$. A factor +1 or −1 is added to the delayed signal $f_b$ by a factoring circuit 10. When the factor is +1, the transversal filter becomes an even-type transversal filter, and when the factor is −1, the transversal filter becomes an odd-type transversal filter. The factor added signal from the factoring circuit 10 is added with the input signal $f_a$ by an adder 11 to be an output signal $f_0$ in the case of the even-type transversal filter or $f_1$ in the case of the odd-type transversal filter, which is outputted from an output terminal 13. This filtering process is expressed by a vector diagram shown in FIG. 3(b). As seen from FIG. 3(b), the relative phase difference between the input signal $f_a$ of the even-type transversal filter and the output signal $f_b$ of the even-type transversal filter is always 90°.

The transfer function of the transversal filter shown in FIG. 3(a) is expressed as follows:

Even-type transversal filter
$$f_0(\omega) = f_a(\omega) + f_b(\omega) \quad (4)$$
$$= f_a(\omega) \cdot \{1 + \exp(-j\omega T)\}$$
$$= 2f_a(\omega) \cdot \cos\frac{\omega T}{2} \cdot \exp\left(-j\frac{\omega T}{2}\right)$$

Odd-type transversal filter
$$f_1(\omega) = f_a(\omega) + f_b(\omega) \quad (5)$$
$$= f_a(\omega) \cdot \{1 - \exp(-j\omega T)\}$$
$$= 2f_a(\omega) \cdot \sin\frac{\omega T}{2} \cdot \exp\left(-\frac{j\omega T}{2} + \frac{j\pi}{2}\right)$$

(where $\omega = 2\pi f$, f: frequency)

Of equations (4) and (5), the second term represents frequency characteristic and the third term represents phase characteristic. These indicate they have linear phase characteristic and constant group delay. This means that the FM video signal does not undergo group delay distortion when passed through the transversal filters. Furthermore, as a modification of an even-type transversal filter, the output $f_c$ at the T/2 delay tap 14 of the delay element 9 (delay T) can be used in place of the output of the even-type transversal filter. This is expressed by the following equation:

$$f_c(\omega) = f_a \cdot \exp(-j\omega T/2) \quad (6)$$

As understood from comparison between equations (4) and (6), $f_0(\omega)$ and $f_c(\omega)$ are of the same phase. Accordingly, the T/2 delay tap output can be used instead of the output of the even-type transversal filter.

Figure 4A:
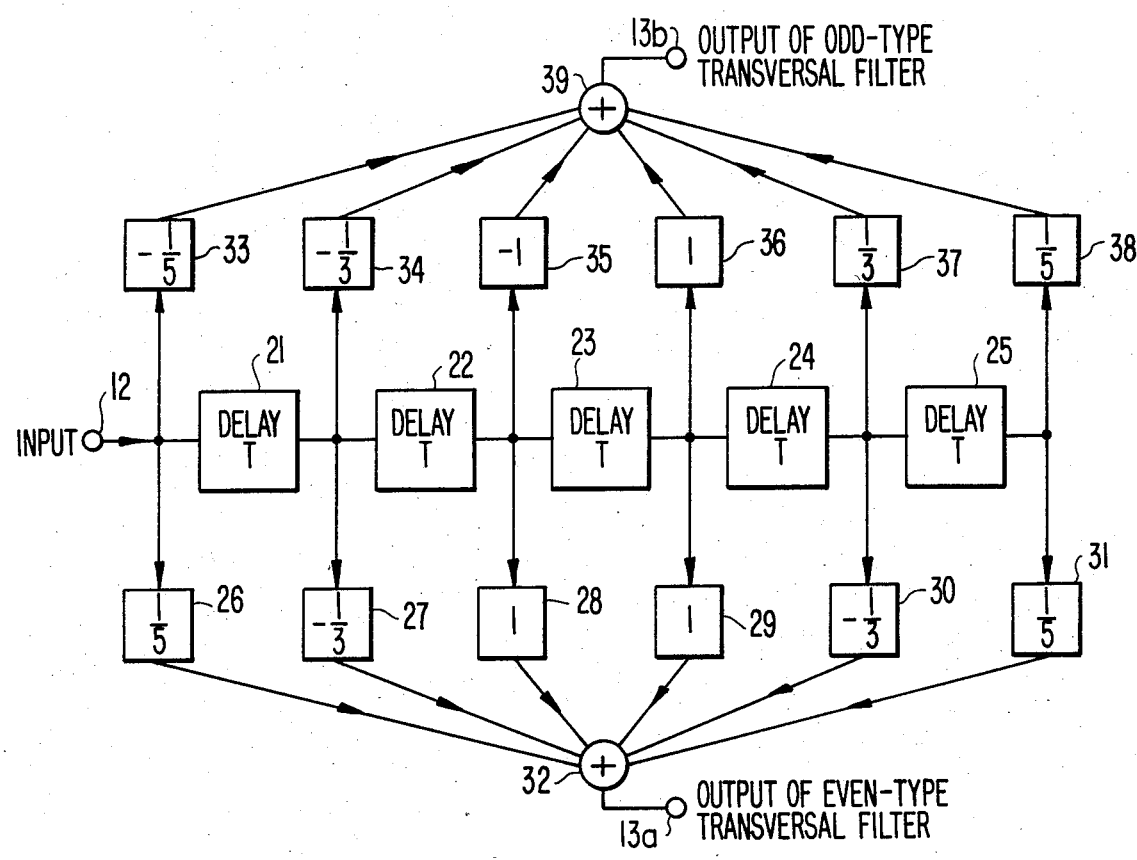
FIGS. 4(a) and 4(b) are block diagrams of transversal filters including 5-stage delay elements.
Figure 4B:
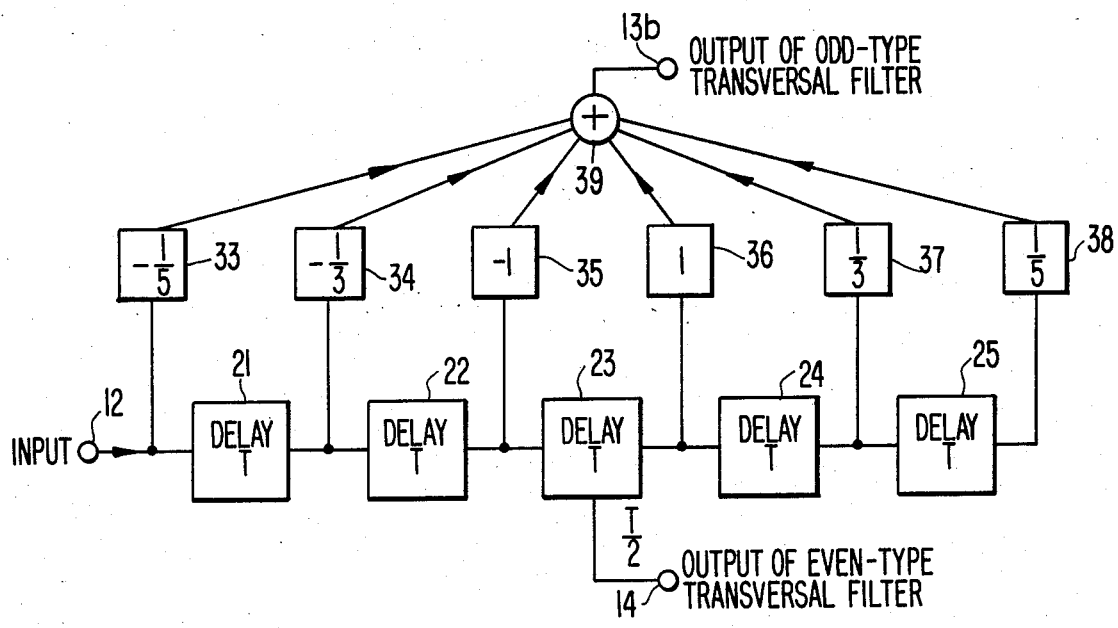

As is apparent from equations (4) and (5), the frequency characteristics are sinusoidal (sine and cosine wave, respectively). Taking the influence on the video signal demodulated from the FM video signal into consideration, it is preferable that the frequency characteristic is constant. In order to achieve this, multistage transversal filters may be used. FIGS. 4(a) and 4(b) show examples of transversal filters having 5-stage delay elements, which enable the frequency characteristic in the frequency range of about 2–16 MHz to be constant.

Referring to FIG. 4(a), the transversal filter is constructed by delay elements 21–25 (delay time of each of them being T), a first group of factoring circuits 26–31, an adder 32 for adding outputs of the factoring circuits 26–31, a second group of factoring circuits 33–38, and an adder 39 for adding outputs of the factoring circuits 33–38. An output signal of the adder 32 is an output signal of an even-type transversal filter and is outputted from an even-type output terminal 13a. An output signal of the adder 39 is an output signal of an odd-type transversal filter and is outputted from an odd-type output terminal 13b. Referring to FIG. 4(b), the first group of factoring circuits 26–31 and the adder 32 in the FIG. 4(a) arrangement are removed, and instead, a T/2 delay tap 14 is provided. In the same way as the FIG. 3(a) embodiment, a signal obtained at the T/2 delay tap 14 is identical with the output signal of the even-type transversal filter.

Figure 5A:
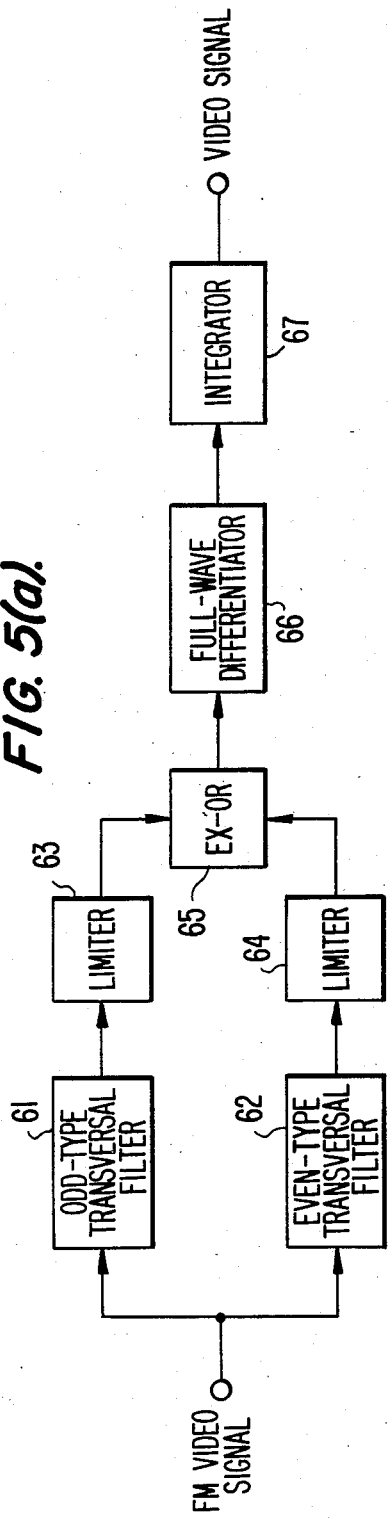
FIGS. 5(a) and 5(b) are block diagrams showing further embodiments of an FM signal demodulator according to the present invention.
Figure 5B:
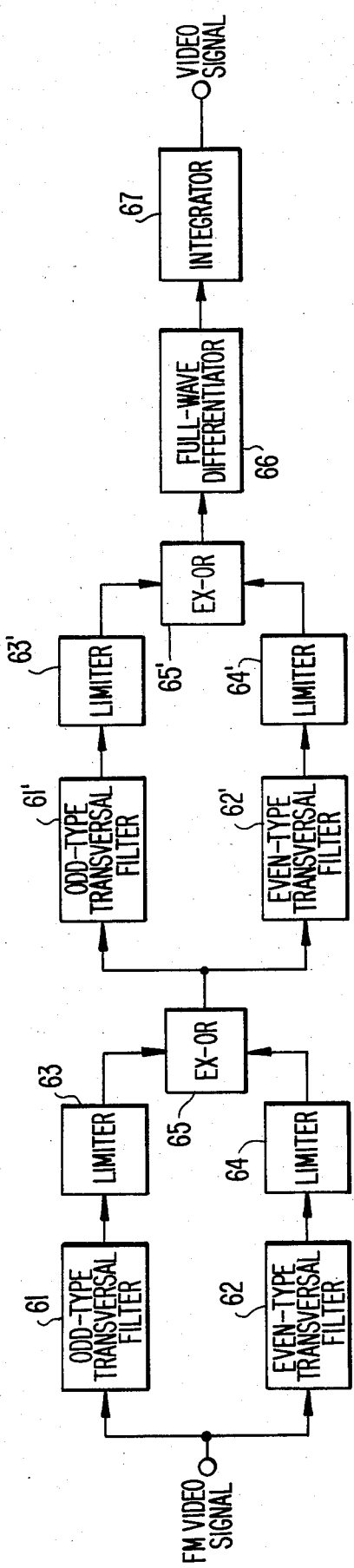

The operations and features of the above described transversal filters are fully explained in "The use of charge-coupled devices for single-sideband modulation" by A. Chowaniec and G. S. Hobson, International Conference on Techniques and Applications of Charge-Coupled Devices, 1974, pp. 237-244.

Other embodiments of FM signal demodulator of the invention are shown in FIGS. 5(a) and 5(b). From the input FM video signal are obtained two rectangular pulse-train signals which are different in phase by 90° from each other by the combination of the odd-type transversal filter 61 and the limiter 63 and the combination of the even-type transversal filter 62 and the limiter 64, respectively. The two signals outputted from the limiters 63 and 64 are applied to an exclusive OR (EX-OR, hereafter) circuit 65 to form a pulse-train signal whose carrier frequency is doubled with respect to the carrier frequency of the input FM video. The EX-OR circuit 65 can be replaced by a known coincidence circuit.

Referring to FIG. 5(a), the output signal of the EX-OR circuit is rectified by a full-wave rectifier 66 so that a pulse-train signal having quadrupled carrier frequency is obtained at the output terminal of the full-wave rectifier 66. The frequency-quadrupled output signal of the full-wave rectifier 66 is supplied to an integrator 67 to be demodulated so as to form a video signal which is identical with the original video signal.

Referring to FIG. 5(b), after the EX-OR circuit 65 is connected another frequency-doubling circuit constructed by transversal filters 61' and 62', limiters 63', 64' and EX-OR circuit 65', which is identical with the frequency-doubling circuit constructed by transversal filters 61 and 62, limiters 63 and 64 and EX-OR circuit 65. In this arrangement, the frequency of the output signal of the full-wave rectifier 66 is 8 times the carrier frequency of the input FM video signal. In the same way, plural frequency-doubling circuits can be connected in cascade so as to obtain a signal having a frequency which is 16 or 32 or more times the carrier frequency of the input FM video signal.

When the FM signal demodulator according to the present invention is used, components of FM video signal up to the third lower sideband are suppressed, and thus the following condition is given:

$$f_c \geq f_{ab} \quad (3)$$

wherein $f_c$ is carrier frequency and $f_{ab}$ is video signal band.

On the other hand, with the conventional FM signal demodulator, if components of the FM video signal up to the third lower sideband ($f_{3w}$) are suppressed, then the following condition is given:

$$f_{3w} = 2f_c - 3f_{ab} \geq f_{ab}$$

$$f_c \geq 2f_{ab} \quad (7)$$

Figure 6A:
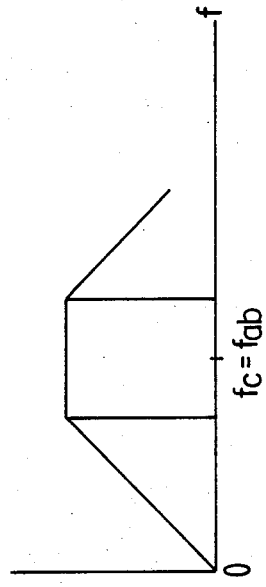
FIGS. 6(a) and 6(b) are frequency allocation diagrams of the FM video signal in FM signal modulators according to the prior art and the present invention, respectively.
Figure 6B:
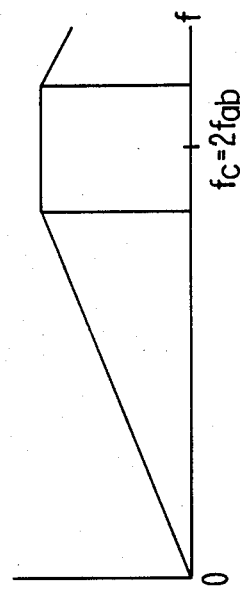

Accordingly, if FM video signal is set according to equations (3) and (7), then the frequency allocations shown in FIGS. 6(a) and 6(b) are obtained with the FM signal demodulator in accordance with the prior art and the present invention, respectively. The diagrams indicate that the demodulator according to the present invention enables setting the carrier frequency $f_c$ to a lower frequency as compared with the prior art demodulator. This, taking the recording and reproducing characteristics of the system, including magnetic tape and magnetic head, particularly for VTR, into consideration, contributes to an improvement in S/N of the reproduced video signal of the VTR because the setting of carrier frequency $f_c$ to a lower band is associated with the use of the better S/N portion of the response.

Further in FIGS. 2, 5(a) and 5(b), the phase shifting means (transversal filter) are separated into two blocks, i.e. even-type and odd-type transversal filters, for easier understanding of the invention. However, as shown in FIGS. 3(a), 4(a) and 4(b), the signals corresponding to the output signals of the even- and odd-type transversal filters can be obtained from a single transversal filter construction.

Finally, instead of the so-called pulse counter technique used in the above-described embodiments, the extraction of the demodulated signal can be made by the conventional techniques or methods, such as the so-called FM signal demodulation method with a delay line or quadrature detection method, a PLL (phase locked loop) technique and TAN method (as exemplified in the Journal of Electronics and Communications Institute J67-B, No. 5, 1984).

What is claimed is:

1. An FM signal demodulator comprising:
   a phase shifting means for producing from an input FM signal two FM signals which are different in phase by 90° from each other;
   a means for detecting phase information of said FM signal from said two FM signals, said phase information detecting means including a means for producing a signal having a frequency which is at least quadrupled with respect to a carrier frequency of said FM signal, and a means for producing from said frequency-quadrupled signal a demodulated signal which is substantially identical with an original signal.

2. An FM signal demodulator according to claim 1, wherein said phase shifting means comprises a transversal filter for producing said two FM signals.

3. An FM signal demodulator according to claim 1, wherein said phase shifting means comprises odd-type and even-type transversal filters for producing said two FM signals, respectively.

4. An FM signal demodulator according to claim 1, wherein said means for producing said frequency-quadrupled signal comprises limiters for limiting the levels of said two FM signals respectively, and full-wave rectifiers for full-wave rectifying output signals of said limiters respectively, and an adder for adding output signals of said full-wave rectifiers.

5. An FM signal demodulator according to claim 4, wherein said means for producing said demodulated signal comprises an integrator for integrating an output signal of said adder.

6. An FM signal demodulator comprising:
   a transversal filter for producing from an input FM signal two FM signals which are different in phase by 90° from each other;
   limiters for limiting the levels of said two FM signals, respectively;
   a logical operation means for producing from output signals of said limiters a signal having a frequency which is twice that of a carrier frequency of said input FM signal;
   a full-wave differentiator for differentiating and full-wave rectifying said signal produced by said logical operation means; and
   an integrator for integrating an output signal of said full-wave differentiator so as to thereby obtain a demodulated signal which is substantially identical with an original signal.

7. An FM signal demodulator according to claim 6, wherein said transversal filter comprises odd-type and even-type transversal filters for producing said two FM signals, respectively.

8. An FM signal demodulator according to claim 6, wherein said logical operation means comprises an exclusive-OR circuit.

9. An FM signal demodulator according to claim 6, wherein said logical operation means comprises a coincidence circuit.

* * * * *